SEMI-CONDUCTOR DEVICE
Filed Dec. 26, 1967
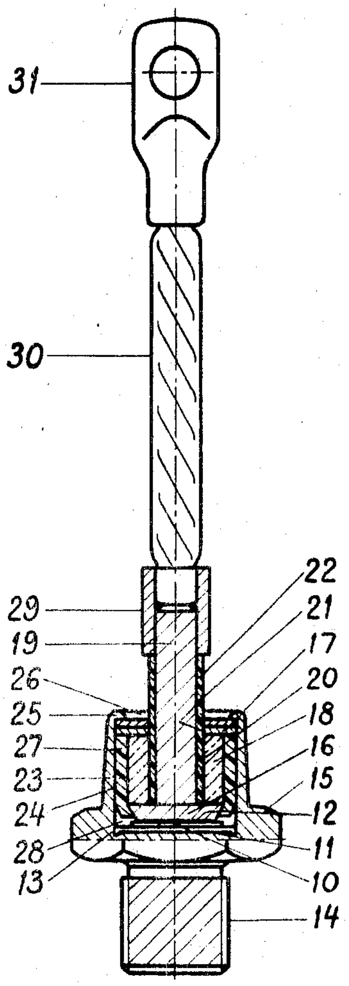
INVENTOR.
NILS ERIC ANDERSSON
GORAN LILJA
BY
Jennings Bailey Jr United States Patent Office 3,513,360

Patented May 19, 1970

3,513,360

SEMI-CONDUCTOR DEVICE

Nils Eric Andersson and Goran Lilja, Ludvika, Sweden, assignors to Allmänna Svenska Elektriska Aktiebolaget, Vasteras, Sweden, a corporation of Sweden Filed Dec. 26, 1967, Ser. No. 693,538
Claims priority, application Sweden, Dec. 27, 1966, 17,734/66
Int. Cl. H01l *1/14*
U.S. Cl. 317—234 8 Claims

ABSTRACT OF THE DISCLOSURE

A semi-conductor device includes a semi-conductor system arranged on a base and a counter electrode which is held pressed against the side of the semi-conductor device facing away from the base by a clamping device. A body of rigid insulating material is arranged between the clamping device and the counter electrode, which body transfers the pressure of the clamping device to the counter electrode and the semi-conductor system. The counter electrode, the insulating body and the clamping device are enclosed in a cap arranged above and joined to the base. A sealing ring of an elastic, electrically insulating material is arranged inside the cap between the clamping device and the semi-conductor system and compressed between the insulating body and the adjacent wall of the cap, which ring separates an inner space containing the semi-conductor system from the clamping device.

BACKGROUND OF THE INVENTION

Field of the invention

The invention relates to semi-conductor devices for high currents.

The prior art

Semi-conductor devices for high currents usually comprise a semi-conductor system with a semi-conductor disc of silicon or germanium, which is usually provided on one or both sides with a support plate having approximately the same coefficient of thermal expansion as the semi-conducting material, fixed to the semi-conductor disc by soldering or alloying. Semi-conductor devices are known in which the semi-conductor system is arranged in pressure-contact with a base member of a material with good thermal conductivity, for example copper on one side and a counter electrode on the other side. The counter electrode can thus be pressed against the semi-conductor device by means of a clamping device insulated from the counter electrode by an interjacent insulating body. The semi-conductor system, clamping device and insulating body in the said known semi-conductor devices are arranged in a hermetically sealed casing consisting of a base member and a cap joined to the base member. The semi-conductor system, counter electrode, insulating body and clamping device are enclosed by the cap. The hermetical sealing of the cap comprises time-consuming soldering, including soldering between its metallic and ceramic parts resulting in high manufacturing costs.

SUMMARY OF THE INVENTION

According to the present invention it has proved possible to make a sufficiently effective sealing for the semi-conductor system without time-consuming soldering. The manufacturing costs can therefore be decreased to a fraction of the previous ones.

The invention relates to a semi-conductor device, such as a crystal diode, a thyristor or a transistor for high currents in which a semi-conductor system is arranged on a base member and a counter electrode is pressed against the side of the semi-conductor system facing away from the base member by means of a clamping device; a body of rigid insulating material being arranged between the clamping device and the counter electrode, which body transfers the pressure of the clamping device to the counter electrode and the semi-conductor system, the counter electrode, the insulating body and the clamping device being enclosed by a cap arranged above and joined to the base member, characterized in that a sealing ring is arranged inside the cap between the clamping device and the semi-conductor system and without constituting a part compressed between the clamping device and the counter electrode which sealing ring separates an inner space containing the semi-conductor system from an outer space containing the clamping device and situated outside this inner space.

As examples of suitable materials in the sealing ring can be mentioned elastomers, such as silicon rubber, fluoro elastomers, for example a copolymer of hexafluoro propylene and vinylidene fluoride and certain heat-resisting types of nitrite rubber as well as resins, for example thermoplastic resins, such as polytetrafluorethylene, polycarbonate, polyethylenglycolterephthalates, polyvinyl chloride, and, further, thermosetting resins, such as soft epoxy resins and soft polyester resins. The above exemplified products are electrically insulating materials which are specially preferred. However, electrically conducting substances can also be used as material in the sealing ring, for instance lead, copper or aluminium. If the sealing ring consists of a conducting substance it is arranged in such a way that it does not come into contact with both the clamping device and the semi-conductor system.

The sealing ring may advantageously have the shape of a tube or case, but it may also consist of an O-ring.

According to an advantageous embodiment of the invention the sealing ring is arranged between the insulating body and the wall situated nearest to the cap.

According to another embodiment of the invention the insulating body has an outer envelope surface which is at least substantially cylindrical, and the sealing ring is arranged around the insulating body. It is thus particularly suitable to form the sealing ring as a tube of an elastic material. It may thus be advantageous to let the tube extend at least around the greater part of the outer envelope surface of the insulating body.

According to a specially advantageous embodiment of the invention with a particularly effectively encased semi-conductor system, the semi-conductor device is impregnated with an impregnating resin. Particularly good results are achieved if the impregnation is carried out as a vacuum impregnation and if such impregnation resins are used which do not contain solvents and which cure without giving off volatile or gaseous components. Examples of suitable impregnation resins are silicone resins, particularly those without solvents, epoxy resins and unsaturated ester resins. During the impregnation, the impregnation resin penetrates and seals existing gaps, for instance those between the clamping device and the cap or between the clamping device and the sealing ring.

According to a further embodiment of the invention the counter electrode is connected to a centrally arranged connection conductor consisting of a rigid, solid metal body which extends through apertures in the insulating body, the clamping device and the cap. The connection conductor should suitably be surrounded by a casing of insulating material. The connection conductor and its casing respectively—if provided with such casing—abut the walls of the openings in the insulating body. The clamping device may advantageously consists of one or more spring washers. It can be kept in position in the cap by holding means of flange-shaped type directed inwardly and situated on the upper side of the cap.

By the expression high currents is meant currents of the magnitude of 10 emperes and above.

The semi-conductor device can consist of a semi-conductor disc of for example silicon or germanium which on one or both sides is provided with thin metal layers applied on the semi-conductor disc, for instance by allowing, vapour deposition, cathode sputtering or by electrolytic deposition. The metal layers can be applied in connection with the doping of the semi-conductor disc or in a separate process afterwards. Examples of metals for these layers are gold, silver, copper, aluminium, nickel, lead, tin and alloys containing at least one of these metals. The semi-conductor system can also consist of a semi-conductor disc which on one or both sides is provided with support plates of molybdenum, tungsten, fernico or other material with substantially the same coefficient of thermal expansion as the semi-conductor disc. Such support plates can be fixed to the semi-conductor disc in a conventional way. It is also possible to avoid completely the use of metal layers and support plates on the sides of the semi-conductor disc, the semi-conductor system then being constituted solely by the semiconductor disc. In this last mentioned case it is suitable to use semi-conductor discs having highly doped surface layers.

BRIEF DESCRIPTION OF THE DRAWINGS

The invention will be explained in more detail by the description of an embodiment with reference to the accompanying drawing in which in which the figure is a section through a semi-conductor device according to the invention in its current direction.

DESCRIPTION OF THE PREFERRED EMBODIMENTS

The diode shown in the figure is intended for a current of, for example 150 amperes. A round silicon disc 10 of p-n-n+ type is soldered on the under side with an aluminium layer not shown to a support plate 11 of molybdenum or other material with approximately the same coefficient of thermal expansion as silicon and on the upper side is provided with an alloyed gold-antimony contact in the form of a layer 12. The semi-conductor system consisting of the elements 10, 11 and 12, is arranged on a base member consisting of the recess 13 in the head 15 of the bolt 14 of copper or aluminium. The counter electrode 16 abuts under pressure the upper side of the semi-conductor system. There is no solder joint between the semi-conductor system and the counter electrode. The contact between them is effected solely by pressure. The pressure is exerted by the clamping device 17, consisting of spring washers abutting the upper end surface of the cylindrical insulating body 18 and pressing the insulating body against the counter electrode. The insulating body consists of a rigid material so that it can transfer the pressure. Thus it may consist of a ceramic material, for instance porcelain, asbestos wood or of a rigid non-deformable synthetic resin, for instance a moulding compound containing a filler, such as a moulding compound containing quartz, stone powder and/or glass fibre as filler and an unsaturated polyester resin, an epoxy resin or a silicone resin as binder.

The contact between the base member and the semi-conductor system can also be achieved by pressure only. It may then be suitable to arrange a silver or gold foil between the support plate 11 and the base member 13. The semi-conductor system can also be soldered to the base member, for example with a gold-tin-solder, arranged between the support plate 11 and the base member.

The counter electrode is joined to a solid, rigid and cylindrical connection conductor of copper or aluminum arranged centrally. The connection conductor extends through a cylindrical hole 20 in the insulating body 18 and through the hole 21 in the spring washers. It is surrounded by a tightly applied casing 22 of insulating material, for instance polytetrafluorethylene, silicon rubber or a ceramic material. Before the counter electrode with the connection conductor is mounted to the semi-conductor device, it is suitable to apply a layer of varnish on the outside of the casing 22, suitably of the same varnish as that used for a later impregnation of the semi-conductor. If the casing 22 is made of deformable material, for instance polytetrafluorethylene it is possible to apply the connection conductor 19 with its casing to fit particularly well into the hole 20 in the insulating body 18. The semi-conductor system, counter electrode, insulating body and clamping device are surrounded by the cap 23 joined with the base member 13 of the same material as that in the bolt 14. The inwardly directed wall 24 is slightly conical. Its diameter increases in the upward direction, that is in a direction from the base member. After the mounting, the upper part of the cap 23 is given an inwardly directed flange 25, serving as a clamping device for the spring washer 17. The cap is open at the top. The opening is designated 26. The spring washers thus serve as a ceiling in the cap. A sealing ring 27 of silicon rubber (for instance SIK 836 from Rehau Plastics, Germany) or some other elastic insulating material is arranged between the spring washers 17 and the semi-conductor system 10, 11 and 12. In the exemplified case the sealing ring has the shape of a tube applied around the insulating body 18 along its whole envelope surface. During mounting the flange 25 is not directed inwardly, but forms a straight continuation of the remaining part of the cap which is directed axially. Due to the wall 24 being conical an effective fastening of the tube 27 is achieved between the insulating body 18 and the wall 24 during the mounting of the semi-conductor device.

When the flange 25 has been bent in, the semi-conductor device is impregnated. It is first evacuated in vacuum, for instance at a pressure of 0.1 mm. Hg. After that the impregnation resin is added, for instance consisting of silicone resin (DC 997 from Dow Corning Corp., U.S.A.). After the pressure has been changed to atmospheric pressure, the semi-conductor device is removed from the bath and placed into a furnace in order to cure the resin. During the impregnation the resin penetrates into the existing gaps between the cup springs 17 and the cap 23, between the sealing ring 27 and the cap 23 and between the casing 22 and the apertures 20 and 21. However, none of the resin, or only a slight amount of it, penetrates to the space 28 inside the sealing ring. Due to the impregnation a particularly reliable sealing is achieved of the space 28.

After the impregnation the connection conductor is fixed to the top connection 29, which, in turn, is fixed to the cable 30, which is provided with the cable socket 31.

When the semi-conductor device consists of a thyristor or a transistor, the necessary connection for a gate electrode in a thyristor or for a conductor to the base in a transistor can be arranged in the semi-conductor system, for example by passing the connection conductor through a hole, made for that purpose, between the insulating body 18 and the casing 22 and through the cup spring 17.

What is claimed is:

1. Semi-conductor device, in which a semi-conductor system is arranged on a base and a counter electrode is held pressed against the side of the semi-conductor system facing away from the base by a clamping device, a body of rigid insulating material being arranged between the clamping device and the counter electrode, which body transfers the pressure of the clamping device to the counter electrode and the semi-conductor system, the counter electrode, the insulating body and the clamping device being enclosed by a cap arranged above and joined to the base, characterised in that a sealing ring of an elastically insulating material is arranged inside the cap between the clamping device and the semi-conductor system and between the outside of the body of rigid insulating material and the wall of the cap, which ring separates an inner space containing the semi-conductor system from an outer space containing the clamping device.

2. Semi-conductor device according to claim 1, characterized in that the insulating body has an at least substantially cylindrical outer envelope surface and that the sealing ring comprises a tube arranged around the insulating body.

3. Semi-conductor device according to claim 2, characterized in that the tube extends along at least the greater part of the outer envelope surface of the insulating body.

4. Semi-conductor device according to claim 1, characterized in that it is impregnated with an impregnating resin.

5. Semi-conductor device according to claim 1, characterized in that the counter electrode is connected to a centrally arranged connection conductor comprising a rigid, solid, metal body extending through openings in the insulating body, clamping means and cap.

6. Semi-conductor device according to claim 1, characterized in that the connection conductor is surrounded by a casing of insulating material fitting closely to the walls of the opening in the insulating body.

7. Semi-conductor device according to claim 1, characterized in that the clamping device comprises at least one spring washer.

8. Semi-conductor device according to claim 1, characterized in that the cap is open at the top and that the clamping device is supported at its peripheral part by inwardly directed attachment means having a flange-like shape arranged at the top of the cap.

References Cited

UNITED STATES PATENTS

| | | | |
|---|---|---|---|
| 3,059,157 | 10/1962 | English et al. | 317—234 |
| 3,293,510 | 12/1966 | Pfaffenberger et al. | 317—235 |
| 3,337,781 | 8/1967 | Ferree | 317—234 |
| 3,418,543 | 12/1968 | Marino et al. | 317—234 |

FOREIGN PATENTS

| | | |
|---|---|---|
| 1,047,778 | 11/1966 | Great Britain. |

JOHN HUCKERT, Primary Examiner

R. F. POLISSACIC, Assistant Examiner

U.S. Cl. X.R.

317—235